United States Patent [19]
Dishongh et al.

[11] Patent Number: 6,094,144
[45] Date of Patent: Jul. 25, 2000

[54] METHOD AND APPARATUS FOR EARLY DETECTION OF RELIABILITY DEGRADATION OF ELECTRONIC DEVICES

[75] Inventors: Terrance J. Dishongh, Hillsboro; David H. Pullen, Portland, both of Oreg.

[73] Assignee: Intel Corporation, Santa Clara, Calif.

[21] Appl. No.: 09/173,513

[22] Filed: Oct. 15, 1998

[51] Int. Cl.[7] .................................................. G08B 21/00
[52] U.S. Cl. .......................... 340/653; 340/661; 340/635; 257/48; 327/52; 327/97
[58] Field of Search .................................. 340/653, 630, 340/661, 635; 257/48, 620; 327/52, 65, 64, 97

[56] References Cited

U.S. PATENT DOCUMENTS

| | | | |
|---|---|---|---|
| 4,288,694 | 9/1981 | Ahrons | 250/374 |
| 4,672,849 | 6/1987 | Hoshino | 73/579 |
| 5,057,775 | 10/1991 | Hall | 324/158 R |
| 5,670,821 | 9/1997 | Bowers | 257/547 |
| 5,754,060 | 5/1998 | Nguyen et al. | 326/86 |
| 5,844,249 | 12/1998 | Takano et al. | 250/559.34 |

Primary Examiner—Daniel J. Wu
Assistant Examiner—Sihong Huang
Attorney, Agent, or Firm—Raymond J. Werner

[57] ABSTRACT

A circuit that senses changes in the electrical characteristics of a guard ring, and generates one or more signals based, at least in part, on the electrical characteristics that are sensed, is incorporated into an integrated circuit. The one or more signals generated by the circuit are indicative of the reliability of the integrated circuit.

In one embodiment of the present invention, a first point of the guard ring is electrically coupled to a voltage supply node by a switchable element such as a MOSFET, and at least two points of the guard ring are electrically coupled respectively to two input terminals of a differential amplifier circuit in such a way that voltage changes across the guard ring can be sensed.

15 Claims, 6 Drawing Sheets

METHOD AND APPARATUS FOR EARLY DETECTION OF RELIABILITY DEGRADATION OF ELECTRONIC DEVICES

BACKGROUND OF THE INVENTION

1. Field of the Invention

The invention relates to the packaging of electronic devices, and more particularly to determination of reliability degradation.

2. Background

Advances in semiconductor manufacturing technology have led to the integration of millions of circuit elements, such as transistors, on a single integrated circuit (IC). As a direct result of incorporating more circuit elements on ICs, the level of functionality of these ICs has increased dramatically. Consequently, there has been a greater need for input/output (I/O) terminals with which to communicate with the additional circuitry on complex logic devices such as, for example, microprocessors.

I/O terminals were traditionally formed by way of metal pads along the periphery of an IC. These pads were then electrically connected to conductive pathways on a package by wires. Such wires, typically made of gold, have been referred to as bond wires, and the process of connecting the pads to the package has been referred to as wire bonding.

For many years wire bonding the pads, which were formed along the periphery of an IC, to connection points on a package was adequate to service the required number of I/O terminals. However, as the number of required I/O terminals reached into the hundreds, a form of I/O connection that allowed substantially the whole surface of an IC, and not only the periphery, to be available for I/O connections became popular. This form of I/O connection is known in the industry as controlled collapse chip connection, or C4. The expression "flip chip" has also been used to refer to the C4 I/O connection structures and methods.

Integrated circuits having a controlled collapse chip connection I/O configuration typically have hundreds of terminals, often referred to as bumps, that are formed on the surface of the IC. The bumps are attached to conductive material in the IC so that signals can be communicated between the IC and components that are external to the IC. The conductive material is generally a metal, such as aluminum or copper, and this metal is further interconnected with other metal lines or interconnect structures of the IC. After the bumps are formed on the IC, they are mated to corresponding connection points in a package. Subsequently, a material, such as an epoxy, is used to fill the gaps between the bumps to complete the assembly process.

The package and the integrated circuit tend expand at different rates when heated. This mismatch introduces mechanical stresses that can result in delamination of the integrated circuit, or cracking of the guard ring of the integrated circuit. Both cracking and delamination are known reliability problems. These problems occur more frequently when the differences in thermal expansion rates are larger rather than smaller. For example, the difference in thermal expansion rates between integrated circuits formed in silicon substrates and mated to ceramic packages is less than the difference between those ICs that are mated to organic land grid array packages.

What is needed are methods and apparatus for non-destructively determining if the reliability of a packaged electronic device has been degraded.

SUMMARY OF THE INVENTION

Briefly, a circuit that senses changes in the electrical characteristics of a guard ring, and generates one or more signals based, at least in part, on the electrical characteristics that are sensed, is incorporated into an integrated circuit.

In a further aspect of the present invention, the one or more signals generated by the circuit are indicative of the reliability of the integrated circuit.

DETAILED DESCRIPTION

Overview

Integrated circuits typically have guard ring structures disposed along their peripheral edges. When integrated circuits are subjected to repeated mechanical stresses it is possible that the guard ring structure may crack or become delaminated. Either of these situations, that is, cracking or delaminating of the guard ring, can be an indicator of a pending functional failure of the integrated circuit. Typically the guard ring resides closer to the peripheral edges of the integrated circuit than do the solder bumps used in C4 I/O connection architectures. Furthermore, the mechanical stresses that lead to cracking or delamination of the guard ring also lead to failures of the solder bumps. Therefore, detection of guard ring failures act as an early warning of potential functional failure of the integrated circuit due to mechanical failure of the solder bumps, which in turn result in their inability to properly carry electrical signals.

Embodiments of the present invention can sense cracking and delamination of guard rings. By providing information on the status of the integrity of the guard ring in a packaged device, the present invention facilitates maintenance of electronic systems, as well as failure analysis.

Terminology

The terms, chip, integrated circuit, monolithic device, semiconductor device, and microelectronic device, are often used interchangeably in this field. The present invention is applicable to all the above as they are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, such as aluminum (Al), copper (Cu), an alloy of Al and Cu, an alloy of Al, Cu and silicon (Si), tungsten (W), and nickel (Ni) are conductors that provide signal paths for coupling or interconnecting, electrical circuitry. Other conductors, both metal and non-metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal suicides are examples of other conductors.

The terms contact and via, both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

The term vertical, as used herein, means substantially perpendicular to the surface of a substrate.

Figure 1:
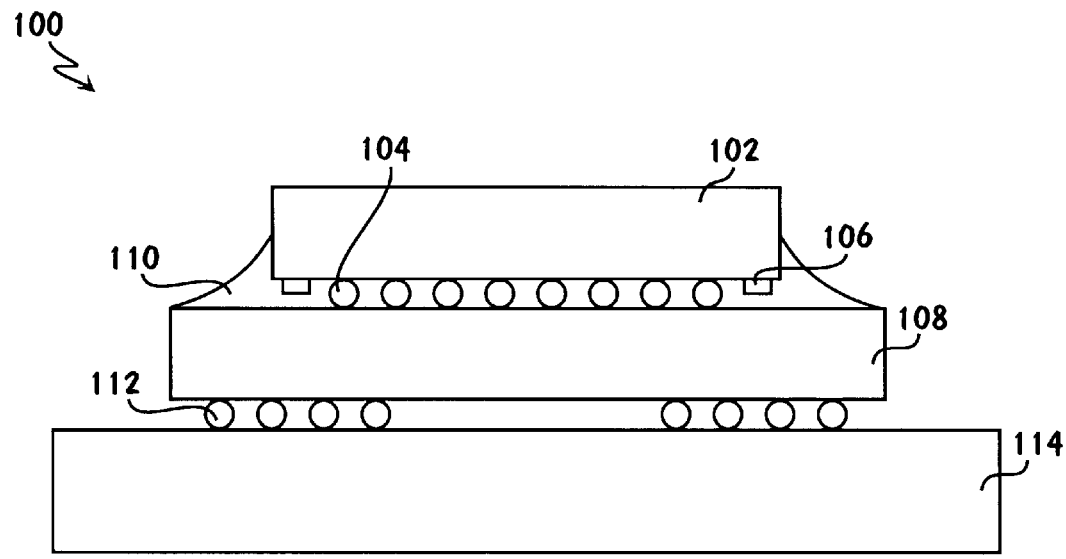
FIG. 1 is a schematic cross-section of an integrated circuit having C4 I/O terminals mated to a package substrate, and the package substrate mated to a printed circuit board.

Referring to FIG. 1, an assembly 100 includes an integrated circuit with C4 I/O terminals attached to a packaging substrate which, in turn, is attached to a printed circuit board. More particularly, assembly 100 includes an integrated circuit 102. Typically, although not required to be, integrated circuit 102 is formed from a silicon substrate. C4 I/O terminals 104 are attached to integrated circuit 102. C4 I/O terminals 104 are sometimes referred to as solder bumps, or solder balls. These solder bumps 104 are further attached to a packaging substrate 108. Packaging substrate 108 may be made of a ceramic material, or more commonly, it may be made of an organic material. One common type of packaging substrate 108 is the organic land grid array (OLGA). Packaging substrate 108 has a first surface adapted to make electrical contact with integrated circuit 102, and a second surface adapted to make electrical contact with a printed circuit board 114. Those skilled in the art will recognize that packaging substrate 108 has a plurality of conductive paths therethrough for interconnecting integrated circuit 102 with printed circuit board 114.

An epoxy layer 110 is formed so as to substantially fill the interstitial spaces between solder bumps 104, integrated circuit 102, and packaging substrate 108.

Figure 2:
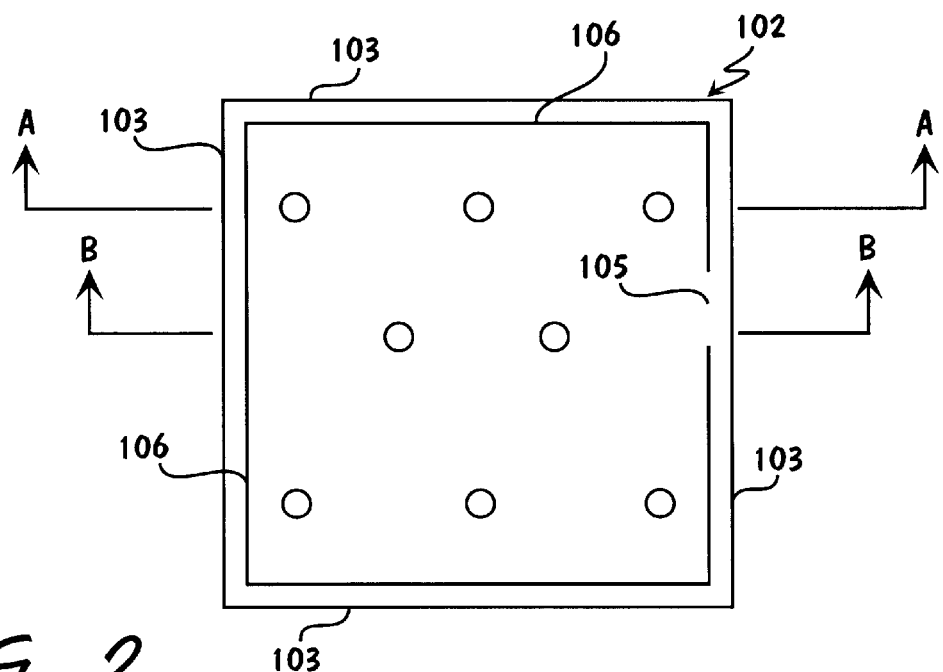
FIG. 2 is a schematic top view of an integrated circuit having C4 I/O terminals and a guard ring in accordance with the present invention.

Still referring to FIG. 1, a guard ring 106 can be seen at the peripheral edges of integrated circuit 102. Guard ring 106 is typically, although not required to be, a multi-level structure wherein interconnect lines on each interconnect level of integrated circuit 102 are placed along the peripheral edges in vertical alignment with each other, and are interconnected by vias. FIG. 2 provides a top view of integrated circuit 102 and shows guard ring 106 on the uppermost level of interconnect of integrated circuit 102. It can be seen in FIG. 2 that guard ring 106 resides substantially along peripheral edges 103 of integrated circuit 102. Guard ring 106 is formed such that an opening, or gap 105, exists along one of peripheral edges 103. Gap 105 is preferably formed at approximately the center of a peripheral edge.

Referring again to FIG. 1, packaging substrate 108 has solder balls 112 attached thereto. Solder balls 112 are further attached to printed circuit board 114. In this way electrical connection is established between integrated circuit 102 and printed circuit board 114.

Integrated circuit 102 generates heat when it is operated. If assembly 100 includes an integrated circuit 102 attached to a packaging substrate 108 having different thermal expansion characteristics, then the stress caused by the thermal cycles that accompany turning integrated circuit 102 on and off tends to cause delamination and/or cracking of thin film layers on integrated circuit 102. In particular, integrated circuits packaged with organic land grid arrays are prone to failure due to thin film delamination and thin film cracking. Embodiments of the present invention include structures and circuitry on integrated circuit 102 that are used to generate one or more signals that are predictive of the reliability of integrated circuit 102.

Figure 3:
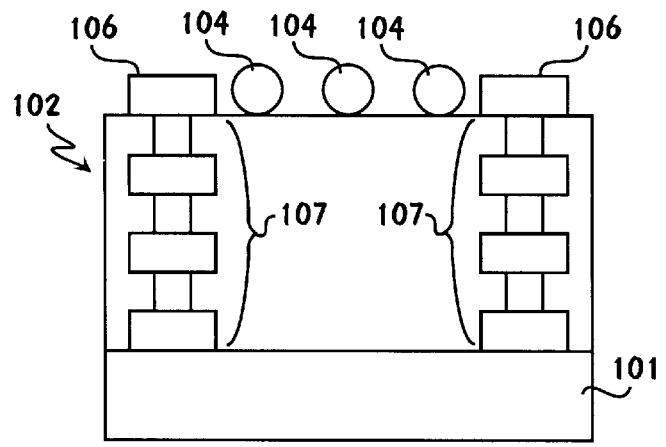
FIG. 3 is a schematic cross-sectional view taken along line A—A of FIG. 2 where the integrated circuit has a multi-level guard ring.

FIG. 3 shows a schematic cross-section of integrated circuit 102 taken along line A—A in FIG. 2. Solder bumps 104 and guard ring 106 are seen along the top surface of integrated circuit 102. In the embodiment shown in FIG. 3, guard ring 106 is a multi-level guard ring and includes a lower portion 107 as can be seen in FIG. 3. Lower portion 107 includes interconnect lines on lower interconnect levels and vias for connecting those interconnect lines to each other. Typically, the guard ring, including lower portion 107, exists from the top surface, down to the surface a substrate 101, upon which the circuit elements and interconnections of integrated circuit 102 are fabricated.

Figure 4:
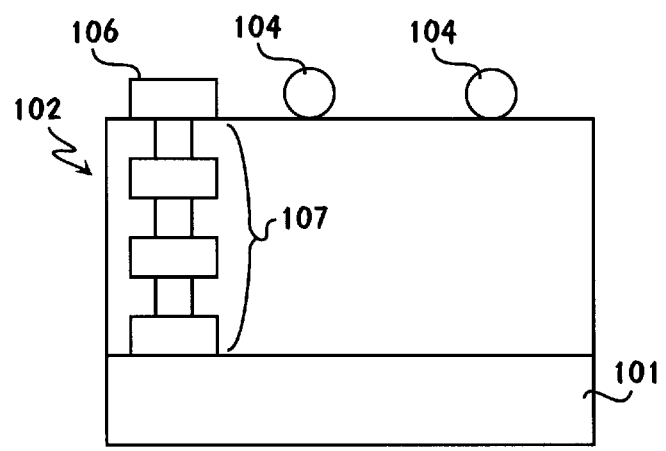
FIG. 4 is a schematic cross-sectional view taken along line B—B of FIG. 2 where the integrated circuit has a multi-level guard ring.

FIG. 4 shows a schematic cross-section of integrated circuit 102 taken long line B—B in FIG. 2. Solder bumps 104 and guard ring 106 are seen along the top surface of integrated circuit 102. FIG. 4 is similar to the view shown in FIG. 3, however it can be seen that the structure of guard ring 106, including lower portion 107, is absent from the right side of integrated circuit 102 at line B—B. This corresponds to gap 105 in the structure of guard ring 106. The function of gap 105 will be described below in connection with FIG. 7.

Figure 5:
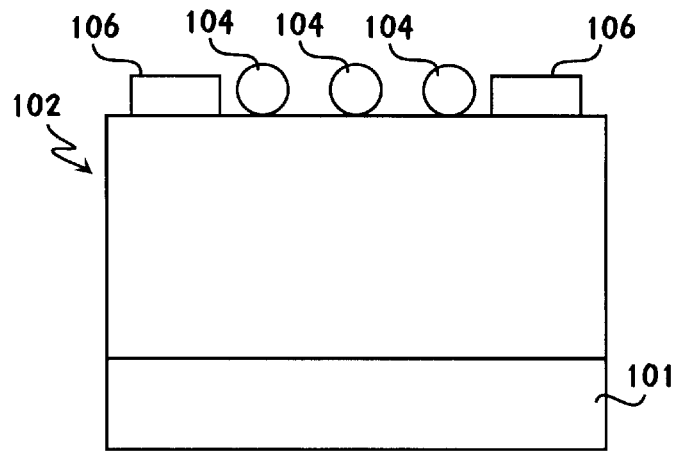
FIG. 5 is a schematic cross-sectional view taken along line A—A of FIG. 2 where the integrated circuit has a single-level guard ring.
Figure 6:
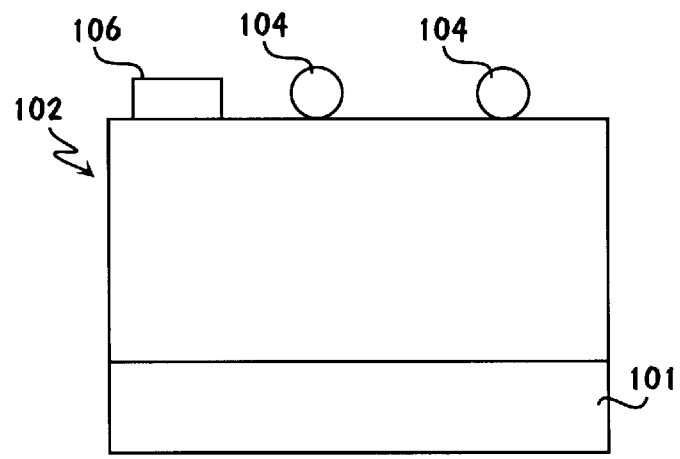
FIG. 6 is a schematic cross-sectional view taken along line B—B of FIG. 2 where the integrated circuit has a single-level guard ring.

Referring to FIGS. 5–6, an alternative guard ring structure is shown in schematic cross-sections. More particularly, guard ring 106 as shown in FIGS. 5–6 is a single level guard ring. That is, in this embodiment guard ring 106 does not include lower portion 107 as shown in FIGS. 3–4.

The specific design of a guard ring may vary from that shown in the illustrative embodiments. Guard rings may have more or fewer levels of interconnect lines and vias. Similarly, some integrated circuits may have more than one guard ring, and those guard rings may have the same or different structures. Furthermore, the placement of the guard rings may be closer to, or further from, the peripheral edges of the integrated circuit. Those skilled in the art and having the benefit of this disclosure will appreciate that a variety of guard ring designs are possible within the scope of the present invention. Guard rings may be multi-level (as shown in FIGS. 3–4) or single-level (as shown in FIGS. 5–6). A single-level guard ring will typically reveal a change in electrical characteristics sooner than a multi-level guard ring. On the other hand, changes in the electrical characteristics of a multi-level guard ring reveal information about, for example, the depth of a delamination.

In one embodiment of the present invention, a first point of the guard ring is electrically coupled to a voltage supply node by a switchable element such as a MOSFET, and at least two points of the guard ring are electrically coupled respectively to two input terminals of a differential amplifier in such a way that voltage changes across the guard ring can be sensed.

Figure 7:
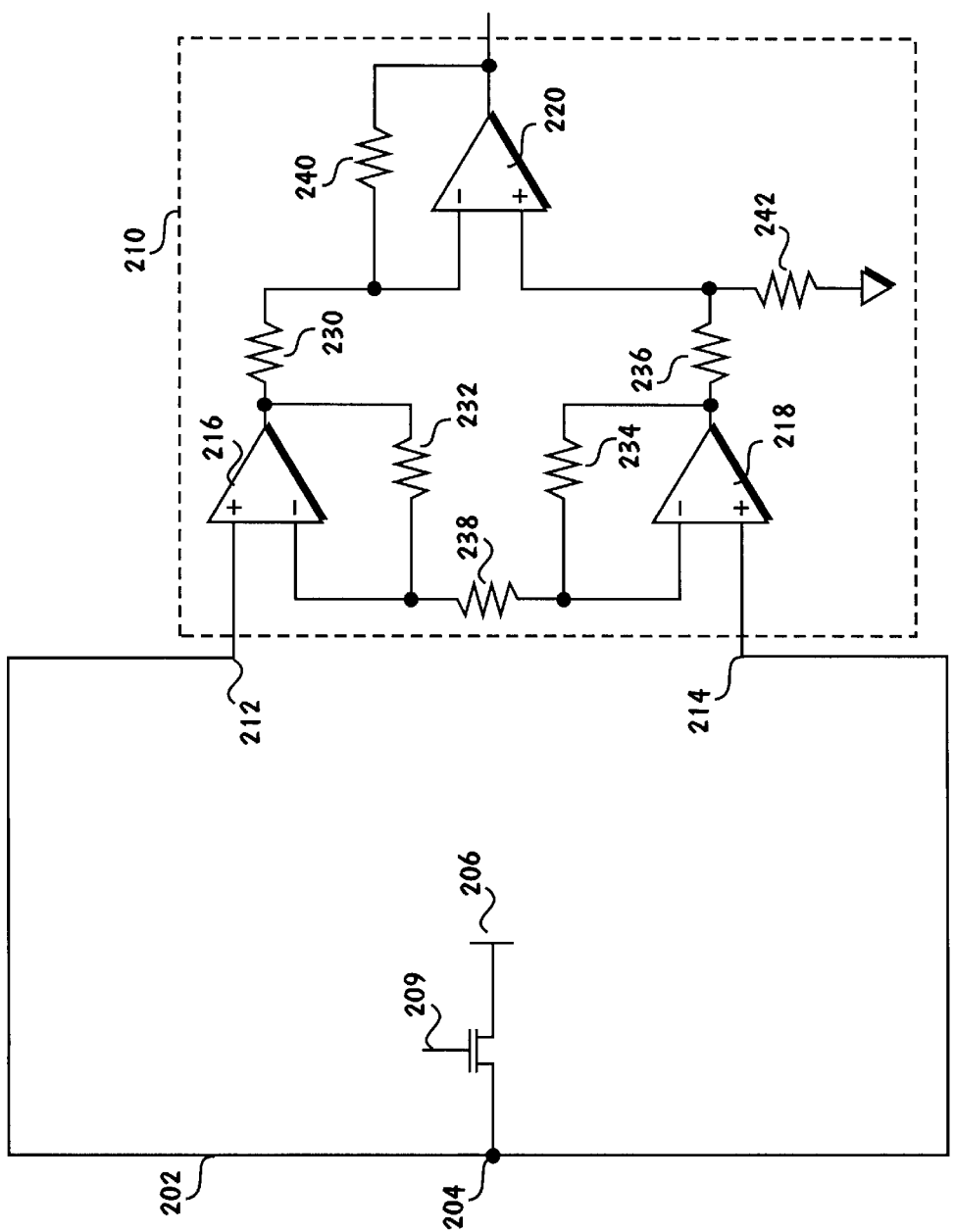
FIG. 7 is a schematic diagram showing a voltage comparator circuit coupled to a guard ring in accordance with the present invention.

FIG. 7 shows a schematic diagram of an embodiment of the present invention. A guard ring 202 is coupled to a voltage supply node 206 at a first position 204 along guard ring 202. In the illustrated embodiment, guard ring 202 is coupled to voltage supply node 206 by a field effect transistor (FET) 208. It will be appreciated that any switchable device including but not limited to a p-channel field effect transistor (PFET), an n-channel field effect transistor (NFET), or a mechanical switch may be used. In alternative embodiments of the present invention, guard ring 202 may be directly connected to voltage supply node 206, or coupled through a resistor, a diode, or other similar devices or combination of devices. FET 208 has a gate terminal 209. Gate terminal 209 may be coupled to a fixed voltage so that FET 208 is always turned on while power is applied to the integrated circuit. Alternatively, gate terminal 209 may be coupled to a control circuit (not shown) that switches FET 208 between its on and off states in response in a predetermined manner. Such control circuits are well known in the art.

Still referring to FIG. 7, a circuit 210 is shown coupled to guard 202. More particularly, a first input terminal of circuit 210 is coupled to guard ring 202 at a second position 212, and a second input terminal of circuit 210 is coupled to guard ring 202 at a third position 214. The length of guard ring 202 from first position 204 to second position 212, is substantially equal to the length of guard ring 202 from first position 204 to third position 214. The portion of the guard ring from the first position to the second position may be referred to as the first segment, and the portion of the guard ring from the first position to the third position may be referred to as the second segment.

As shown in FIG. 7, circuit 210 includes a first operational amplifier (op amp) 216, a second op amp 218, and a third op amp 220. The positive input terminal of op amp 216 is coupled to second position 212, and the positive input terminal of op amp 218 is coupled to third position 218. The output terminal of op amp 216 is coupled to the negative input terminal of op amp 220 through resistor 230. The output terminal of op amp 220 is coupled to the negative input terminal of op amp 220 through resistor 240. The output terminal of op amp 218 is coupled to the positive input terminal of op amp 220 through resistor 236. The positive input terminal of op amp 220 is also coupled to ground through resistor 242. The output terminal of op amp 216 is coupled to the negative input terminal of op amp 216 through resistor 232. The output terminal of op amp 218 is coupled to the negative input terminal of op amp 218 through resistor 234. The negative input terminal of op amp 216 is coupled to the negative input terminal of op amp 218 through resistor 238.

The value of resistor 230 is in the range of 50 Kohms to 100 Kohms. The value of resistor 232 is in the range of 25 Kohms to 50 Kohms. The value of resistor 234 is in the range of 25 Kohms to 50 Kohms. The value of resistor 236 is in the range of 50 Kohms to 100 Kohms. The value of resistor 238 is in the range of 50 Kohms to 100 Kohms. The value of resistors 240, 242 are chosen to be substantially equal to one half the value of resistor 230.

Typically, the voltage at second position 212 is substantially equal to the voltage at third position 214. However, if the guard ring cracks between first position 204 and second position 212, but does not crack between first position 204 and third position 214, then voltage at third position 214 remains unchanged while the voltage at second position 212 decays. This is because third position 214 is still coupled to power supply node 206, while the crack has left second position floating. Likewise, if the guard ring cracks between first position 204 and third position 214, but does not crack between first position 204 and second position 212, then voltage at second position 212 remains unchanged while the voltage at third position 214 decays. Circuit 210 detects the change in voltage between second position 212 and third position 214, regardless of where the crack occurs, and generates an output signal indicative of the cracked guard ring.

While thin film cracking involves the development of an electrical open in a layer of the guard ring, delamination involves the separation of one layer from another. When delamination occurs, the guard ring may be separated from the power supply node. However, both the first segment and the second segment will suffer from the same voltage drop, unlike the case of thin film cracking wherein one segment will be conductive while the other will be electrically open. One way to overcome this is to detect that both segments are unpowered and to report this condition as a delamination event.

The output signal of circuit 210 may be stored so that this information can be read later, or this signal may be coupled to an external connection terminal such as a bond pad, or a solder bump. If the information is to be stored, this may be done in any type of storage mechanism, including but not limited to a latch circuit, a static memory cell, a dynamic memory cell, a non-volatile memory cell, and so on.

Figure 8:
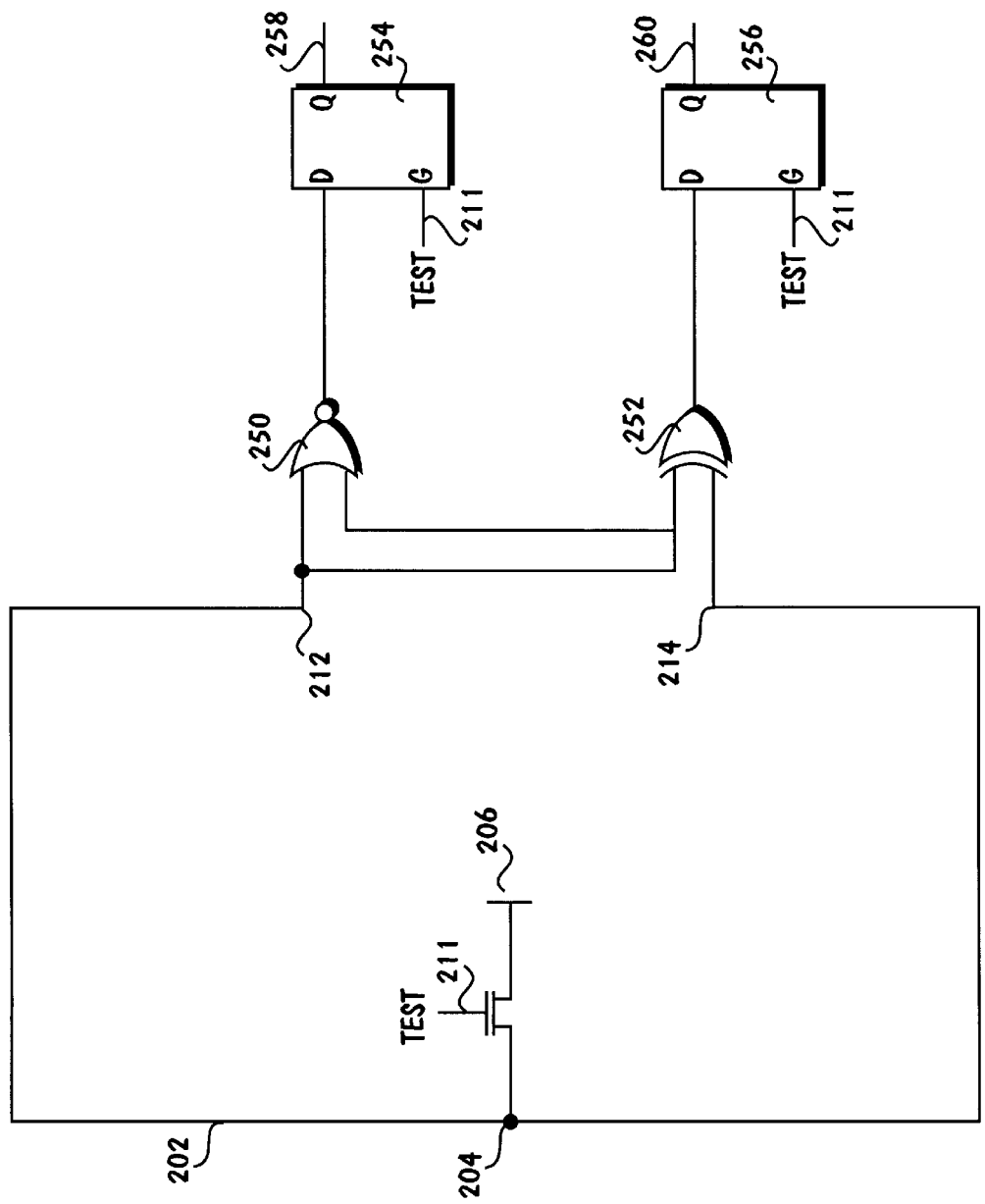
FIG. 8 is a schematic diagram showing a logic circuit coupled to a guard ring in accordance with an embodiment of the present invention.

FIG. 8 shows an alternative circuit embodiment for detecting cracking and delamination of the guard ring. Guard ring 202 is switchably coupled to voltage supply node 206 by a FET at a first position 204. The gate of the FET is coupled to a signal node 211, also labeled "TEST" in FIG. 8. A NOR gate 250 has a first input terminal coupled to guard ring 202 at position 212, and a second input terminal coupled to guard ring 202 at position 214. NOR gate 250 has an output terminal coupled to an input terminal of a gated latch 254. Gated latch 254 has a gate input coupled to signal node 211. The output terminal of gated latch 254 is a logical one in the case where delamination has decoupled the guard ring from the voltage supply node, and is otherwise a logical zero. When the TEST is asserted at signal node 211, guard ring 202 is charged to a positive voltage, NOR gate 250 generates a signal at its output terminal based on the voltages of the first and second segments. The signal generated by NOR gate 250 is latched in gated latch 258 when the signal TEST is deasserted, and is available at an output terminal 258 of gated latch 254.

Still referring to FIG. 8, an XOR gate 252 has a first input terminal coupled to guard ring 202 at position 212, and a second input terminal coupled to guard ring 202 at position 214. XOR gate 252 has an output terminal coupled to an input terminal of a gated latch 256. Gated latch 256 has a gate input coupled to signal node 211. The output terminal of gated latch 256 is a logical one in the case where a crack has decoupled a first segment of the guard ring from a second segment of the guard ring, and is otherwise a logical zero. When the TEST is asserted at signal node 211, guard ring 202 is charged to a positive voltage, XOR gate 252 generates a signal at its output terminal based on the voltages of the first and second segments. The signal generated by XOR gate 252 is latched in gated latch 256 when the signal TEST is deasserted, and is available at an output terminal 260 of gated latch 256.

Those skilled in the art and having the benefit of this disclosure will appreciate that alternative combinatorial logic may be used to discern information from the state of the segments of the guard ring. For example, the guard ring may be charged to a positive voltage during testing, and if both segments are high, then a signal is generated that indicates the guard ring is in good condition. The logic for making the determination can be implemented with an AND gate.

Figure 9:
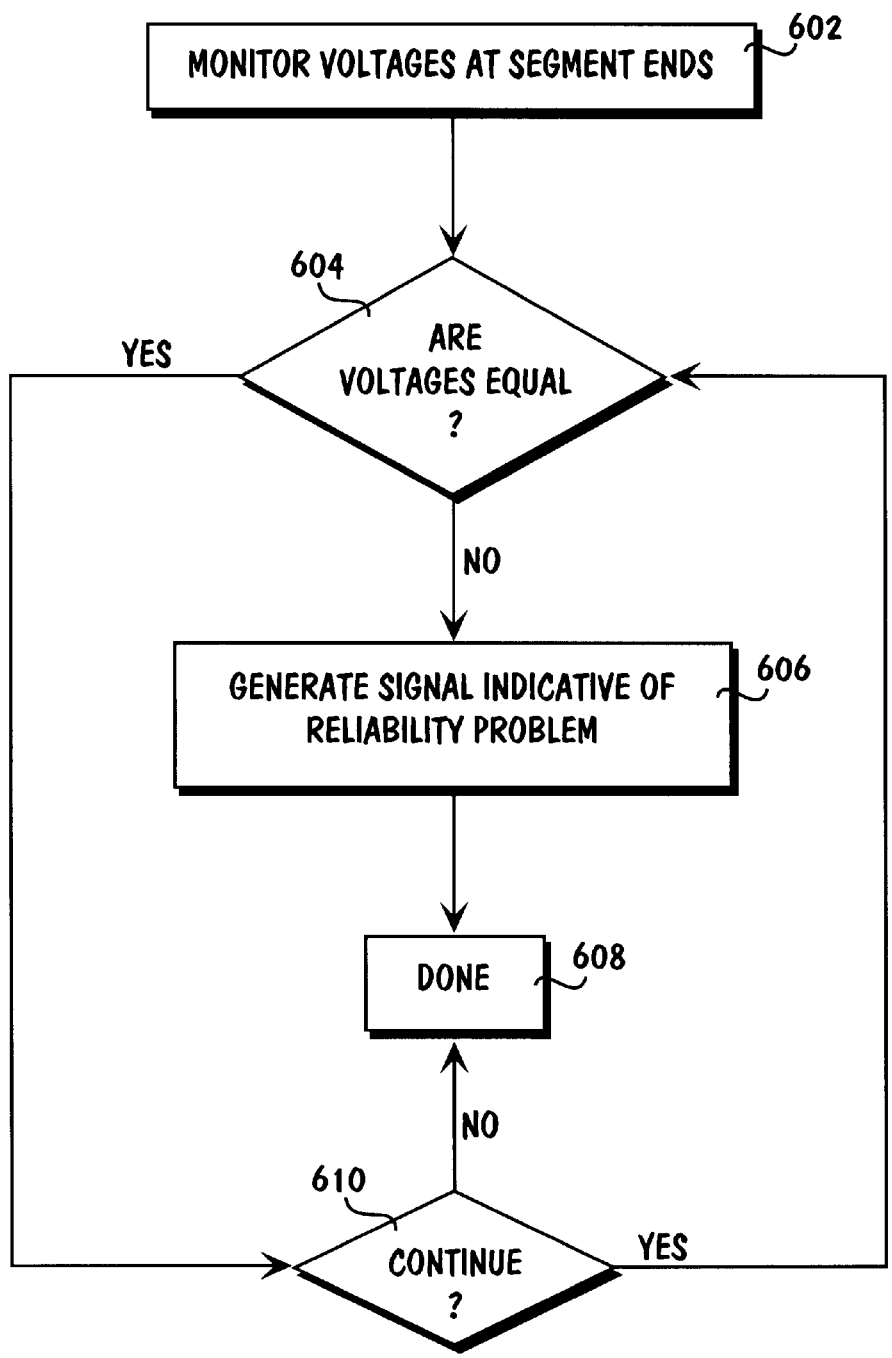
FIG. 9 is a flow diagram illustrating a method in accordance with the present invention.

FIG. 9 shows a flowchart of an illustrative embodiment of the method of the present invention. Referring to FIGS. 7–8, the voltage at second position 212 and third position 214 of guard ring 202 are monitored as shown at block 602. A determination is made, at block 604, as to whether the voltage at second position 212 and third position 214 are substantially equal. If the voltages are not substantially equal then a high probability of a reliability issue exists, and, at block 606, a signal is generated indicative of this determination. The process is then complete at block 608. If a determination is made at block 604 that the voltages are substantially equal, then at block 610 a determination is made as to whether to continue monitoring the voltages. If it is determined to continue, then control flows to block 604. If, however, it is determined to discontinue monitoring, then control flows to block 608 and the process is complete.

Embodiments of the present invention may be used as part of a system-wide reliability check performed upon an electronic system. In such a configuration one or more integrated circuits embodying guard rings and detection circuits, in accordance with the present invention, report their reliability status, based at least in part on determining whether thin film cracking or delamination of the guard ring has occurred, to a system management device or to a system user.

Conclusion

Embodiments of the present invention include structures and circuitry incorporated in an integrated circuit that can determine whether thin film cracking or thin film delamination has occurred, and that can communicate the occurrence of thin film cracking or thin film delamination to other components.

An advantage of embodiments of the present invention is that an early warning of a potential failure of an integrated circuit can be given.

A further advantage of the present invention is that a non-destructive test of an assembled flip chip package can determine whether thin film delamination or thin film cracking has occurred.

It will be understood by those skilled in the art that many design choices are possible within the scope of the present invention. For example, embodiments of the present invention may be used to detect thin film cracking and not delamination. As a further example of design choices, the guard ring may be divided into more than two segments so that the detected failures can be localized to a particular portion of the integrated circuit.

It will be understood that various other changes in the details, materials, and arrangements of the parts and steps which have been described and illustrated may be made by those skilled in the art without departing from the principles and scope of the invention as expressed in the subjoined Claims.

What is claimed is:

1. A microelectronic device having peripheral edges, comprising:
    a voltage supply node;
    a guard ring disposed along the peripheral edges of the microelectronic device, the guard ring coupled to the voltage supply node; and
    a differential amplifier circuit having at least two input terminals and an output terminal;
    wherein the at least two input terminals are coupled to the guard ring; wherein the guard ring comprises a plurality of interconnect lines, at least one of the interconnect lines disposed at an uppermost interconnect level, and at least a portion of the Plurality of interconnect lines disposed at interconnect levels that are lower than the uppermost interconnect level; and
    wherein the guard ring is coupled to the voltage supply node at an interconnect level other than the uppermost interconnect level.

2. The microelectronic device of claim 1, wherein the guard ring has a length that is approximately equal to a sum of the lengths of the peripheral edges.

3. The microelectronic device of claim 1, wherein the guard ring has a length that is less than a sum of the lengths of the peripheral edges.

4. The microelectronic device of claim 1, wherein the output terminal is coupled to an output buffer.

5. The microelectronic device of claim 1, wherein the output terminal is coupled to a storage circuit.

6. The microelectronic device of claim 5, wherein the storage circuit comprises a latch.

7. A microelectronic device having peripheral edges, comprising:
    a voltage supply node;
    a guard ring disposed along the peripheral edges of the microelectronic device, the guard ring coupled to the voltage supply node; and
    a differential amplifier circuit having at least two input terminals and an output terminal;
    wherein the at least two input terminals are coupled to the guard ring; the voltage supply node is coupled to the guard ring at a first position, a first one of the at least two input terminals is coupled to the guard ring at a second position, a second one of the at least two input terminals is coupled to the guard ring at a third position; wherein the second and third positions are different from each other, and a distance from the first position to the second position is substantially equal to a distance from the first position to the third position; a shape of the guard ring between the first position and the second position, is substantially the same as a shape of the guard ring between the first position and the third position; and further comprising a capacitor coupled to the guard ring between the first position and the third position.

8. An integrated circuit, comprising:
    a multi-level guard ring switchably coupled to a voltage supply node at a first position on a first interconnect level;
    a voltage comparator circuit having a first input terminal coupled to the guard ring at a second position on a second interconnect level, a second input terminal coupled to the guard ring at a third position on a second interconnect level, and an output terminal coupled to an external connection point.

9. The integrated circuit of claim 8, the guard ring is switchably coupled to the voltage supply node by a transistor.

10. The integrated circuit of claim 9, further comprising logic circuitry coupled to the transistor and adapted to couple and decouple the guard ring to and from the voltage supply node in response to at least one signal.

11. A method of generating a signal indicative of the reliability of an integrated circuit, comprising:

coupling a guard ring to a voltage supply node;

comparing a voltage at a first position of the guard ring to a voltage at a second position of the guard ring;

generating a signal having a first value if the voltage at the first position of the guard ring is substantially equal to the voltage at the second position of the guard ring; and generating a signal having a second value if the voltage at the first position of the guard ring is substantially different from the voltage at the second position of the guard ring.

12. The method of claim 11, further comprising storing the signal.

13. The method of claim 11, further comprising transmitting the signal.

14. The method of claim 11, wherein generating a signal having a first value if the voltage at the first position of the guard ring is substantially equal to the voltage at the second position of the guard ring, only occurs if the voltages are positive with respect to a ground.

15. A method of indicating the reliability of an integrated circuit, comprising:

coupling a guard ring to a voltage supply node;

logically combining a voltage at a first position of the guard ring with a voltage at a second position of the guard ring;

generating a first signal having a first value if the voltage at the first position of the guard ring and the voltage at the second position of the guard ring represent logical low values, the first signal otherwise having a second value; and generating a second signal having a first value if the voltage at the first position of the guard ring is substantially different from the voltage at the second position of the guard ring, the second signal otherwise having a second value.

* * * * *